United States Patent
Argos et al.

[11] Patent Number: 5,902,131
[45] Date of Patent: May 11, 1999

[54] DUAL-LEVEL METALIZATION METHOD FOR INTEGRATED CIRCUIT FERROELECTRIC DEVICES

[75] Inventors: George Argos, Colorado Springs, Colo.; Tatsuya Yamazaki, Kawasaki, Japan

[73] Assignees: Ramtron International Corporation, Colorado Springs, Colo.; Fujitsu Ltd., Kawasaki, Japan

[21] Appl. No.: 08/853,527

[22] Filed: May 9, 1997

[51] Int. Cl.⁶ .................................................... H01L 21/44
[52] U.S. Cl. .............................. 438/618; 438/3; 438/240; 438/253
[58] Field of Search ................. 438/3, 240, 253, 438/396, 626, 618

[56] References Cited

U.S. PATENT DOCUMENTS

| | | |
|---|---|---|
| 4,040,874 | 8/1977 | Yerman . |
| 4,149,302 | 4/1979 | Cook . |
| 4,647,472 | 3/1987 | Hiraki et al. . |
| 4,811,078 | 3/1989 | Tigelaar et al. . |
| 4,860,254 | 8/1989 | Pott et al. . |
| 4,937,650 | 6/1990 | Shinriki et al. . |
| 4,959,745 | 9/1990 | Suguro . |
| 4,989,053 | 1/1991 | Shelton . |
| 5,036,382 | 7/1991 | Yamaha . |
| 5,046,043 | 9/1991 | Miller et al. . |
| 5,070,036 | 12/1991 | Stevens . |
| 5,081,559 | 1/1992 | Fazan et al. . |
| 5,122,923 | 6/1992 | Matsubara et al. . |
| 5,124,014 | 6/1992 | Foo et al. . |
| 5,146,299 | 9/1992 | Lampe et al. . |
| 5,189,503 | 2/1993 | Suguro et al. . |
| 5,212,620 | 5/1993 | Evans, Jr. et al. . |
| 5,216,572 | 6/1993 | Larson et al. . |
| 5,227,855 | 7/1993 | Momose . |
| 5,319,246 | 6/1994 | Nagamine et al. . |
| 5,350,705 | 9/1994 | Brassington et al. . |
| 5,369,296 | 11/1994 | Kato . |
| 5,374,578 | 12/1994 | Patel et al. . |
| 5,438,023 | 8/1995 | Argos, Jr. et al. . |
| 5,468,684 | 11/1995 | Yoshimori et al. . |
| 5,475,248 | 12/1995 | Takenaka . |
| 5,498,569 | 3/1996 | Eastep . |
| 5,523,595 | 6/1996 | Takenaka et al. . |
| 5,578,867 | 11/1996 | Argos, Jr. et al. . |

FOREIGN PATENT DOCUMENTS

| | | |
|---|---|---|
| 0448151 | 9/1991 | European Pat. Off. . |
| 0514547 | 11/1992 | European Pat. Off. . |
| 59-105364 | 6/1984 | Japan . |
| 60-100464 | 6/1985 | Japan . |
| 60-211871 | 10/1985 | Japan . |
| 62-23149 | 1/1987 | Japan . |
| 63-028069 | 7/1988 | Japan . |
| 1-2523257 | 10/1989 | Japan . |
| 1-265524 | 10/1989 | Japan . |
| 2-183567 | 7/1990 | Japan . |
| 2-183570 | 7/1990 | Japan . |
| 2-184079 | 7/1990 | Japan . |
| 2-186669 | 7/1990 | Japan . |
| 2-208978 | 8/1990 | Japan . |
| 2-232973 | 9/1990 | Japan . |
| 2-288367 | 11/1990 | Japan . |
| 57-48247 | 3/1992 | Japan . |

*Primary Examiner*—Caridad Everhart
*Attorney, Agent, or Firm*—Peter J. Meza, Esq.

[57] ABSTRACT

A dual-level metalization method for ferroelectric integrated circuits includes the steps forming a planarized oxide layer over a partially formed integrated circuit ferroelectric device, forming a cap layer over the planarized oxide layer, forming vias into the planarized oxide layer and cap layer to provide access to the desired first-level metal contacts, and metalizing the selected first-level metal contacts with second-level metal. The cap layer can be doped or undoped titanates, zirconates, niobates, tantalates, stanates, hafnates, or manganates such as doped and undoped PZT (lead zirconate titanate), BST (barium strontium titanate), or SBT (strontium bismuth tantalate).

17 Claims, 17 Drawing Sheets

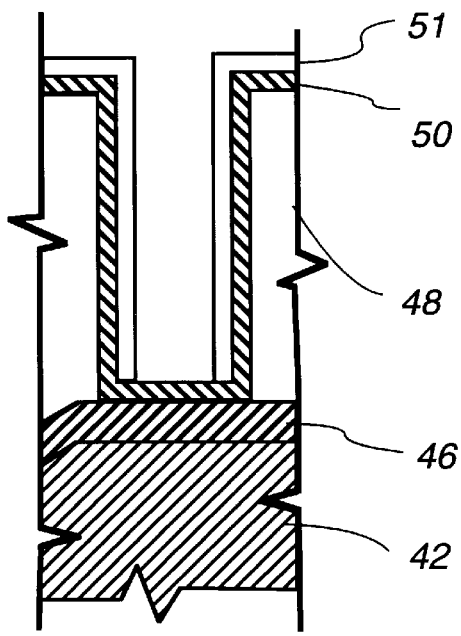
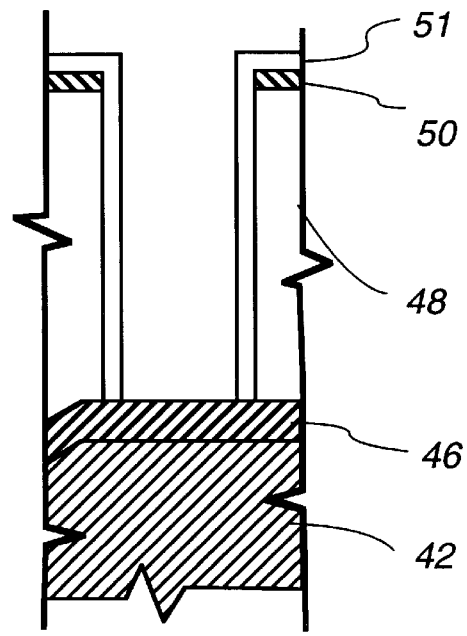
*Fig. 20A*          *Fig. 20B*
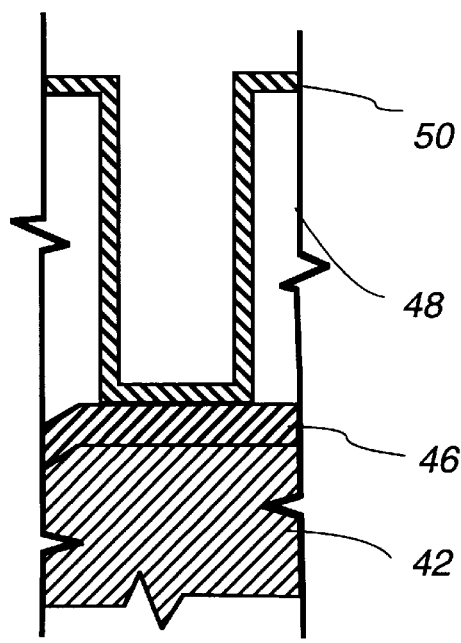
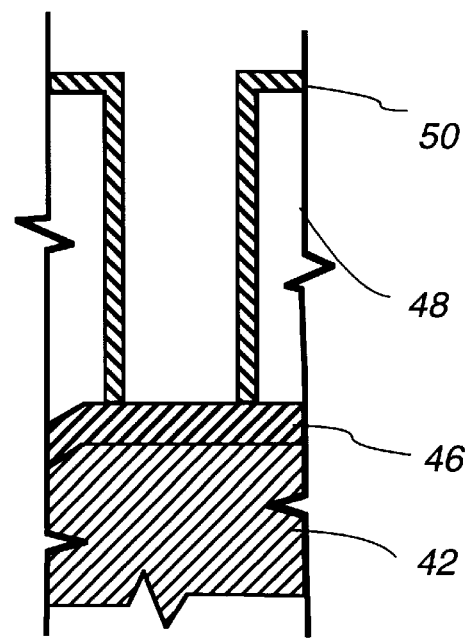
*Fig. 20C*          *Fig. 20D*

DUAL-LEVEL METALIZATION METHOD FOR INTEGRATED CIRCUIT FERROELECTRIC DEVICES

FIELD OF THE INVENTION

This invention relates generally to integrated circuit ferroelectric devices such as ferroelectric capacitors, ferroelectric transistors, ferroelectric memory cells, and the like. More particularly, the present invention relates to a dual-level metalization fabrication method for preventing degradation in the electrical performance of ferroelectric capacitors and transistors.

BACKGROUND OF THE INVENTION

Dual-level or multi-level metalization schemes for integrated circuits are well known and have numerous advantages including smaller integrated circuit die size, increased device speed, ease of design, as well as advantages related to the planarization of device topology.

One of the disadvantages of a multi-level metalization is the increased number of processing steps due to the deposition, patterning, and etching of the required additional metal, oxide, and passivation layers. While the additional processing steps are generally compatible with standard silicon-based integrated circuits, the additional processing steps may adversely affect ferroelectric integrated circuit devices. For example, hydrogen generated during any of the subsequent processing steps may adversely affect the integrity of the ferroelectric dielectric layer of a ferroelectric capacitor, resulting in degraded electrical performance.

What is desired, therefore, is a dual-level metalization method and structure that is compatible with a ferroelectric-based integrated circuit.

SUMMARY OF THE INVENTION

It is, therefore, a principal object of the present invention to provide a dual-level metalization fabrication method that retains the desirable characteristics of these metalization methods, yet is compatible with integrated circuit ferroelectric devices.

It is another object of the invention to improve the electrical switching performance of integrated circuit ferroelectric capacitors and transistors having a dual-level metalization by reducing sensitivity to hydrogen.

It is another object of the invention to improve the overall electrical performance of ferroelectric memory circuits.

It is an advantage of the invention that the fabrication method of the present invention is compatible with existing ferroelectric capacitor and ferroelectric memory fabrication methods.

It is another advantage of the invention that it permits the deposition, patterning, and etching of a dual-level metalization scheme on a ferroelectric-based integrated circuit ferroelectric without subsequent degradation to the electrical performance of the ferroelectric devices.

It is another advantage of the invention that the dual-level metalization method set forth herein can be used in a wide array of ferroelectric-based electronic products such as integrated circuit memories and other ferroelectric integrated circuits, as well as RF/ID integrated circuits and cards.

A first dual-level metalization method for ferroelectric integrated circuits according to the present invention includes the steps of partially forming an integrated circuit ferroelectric device having a plurality of first-level metal contacts, forming a planarized oxide layer over the integrated circuit ferroelectric device, forming a cap layer over the planarized oxide layer, forming vias into the planarized oxide layer and cap layer to provide access to selected first-level metal contacts, and metalizing the selected first-level metal contacts with second-level metal. The second-level metal typically includes tungsten plugs, as well as a second patterned aluminum metal layer.

Second and third alternative dual-level metalization method according to the present invention include the steps of etching vias into the planarized oxide layer first, and then subsequently depositing the cap layer so that the cap layer extends fully or partially along the sidewalls of the vias. Either sloped-sidewall or trench vias can be used. A fourth alternative dual-level metalization method includes the use of a partial cap layer that only selectively protects underlying ferroelectric layers from hydrogen damage.

The cap layer can be fabricated using doped or undoped titanates, zirconates, niobates, tantalates, stanates, hafnates, or manganates such as doped and undoped PZT (lead zirconate titanate), BST (barium strontium titanate), or SBT (strontium bismuth tantalate). The cap layer itself need not be ferroelectric, since the electrical switching performance of the cap layer is not actually used, only its ability to getter hydrogen and thus protect the underlying ferroelectric layers.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 20A–20D are cross-sectional views of a via associated with the third method of the present invention illustrating alternative methods for forming the protective cap layer inside the via.

DETAILED DESCRIPTION

Figure 1:
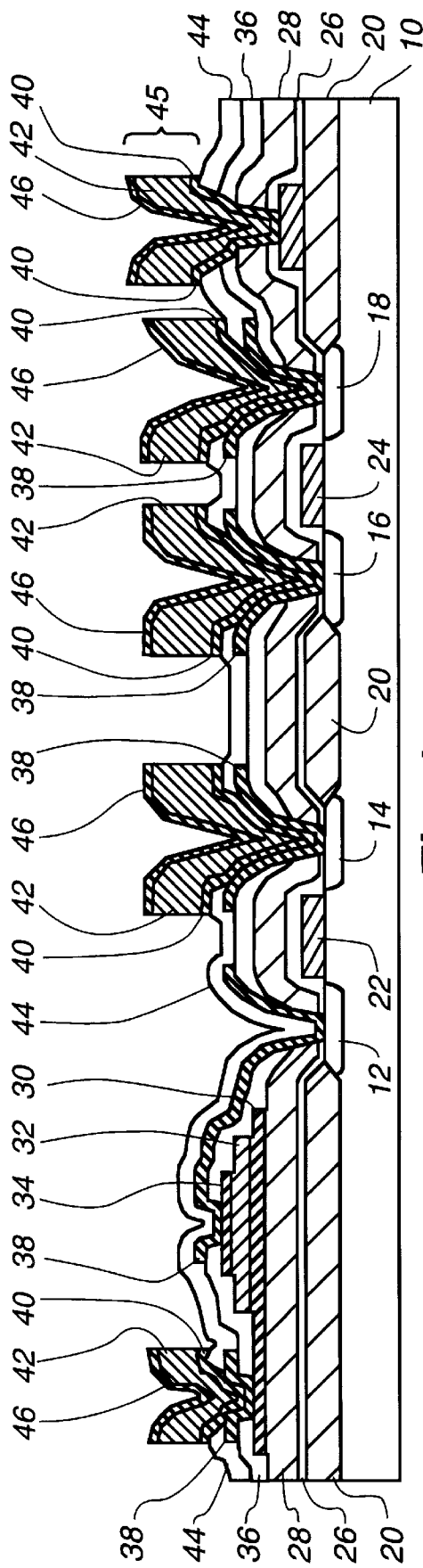
FIGS. 1–8 are sequential cross-sectional views of an integrated circuit ferroelectric memory being fabricated with a dual-level metalization method according to a first method of the present invention.

Referring now to FIG. 1, a portion of a partially fabricated integrated circuit ferroelectric memory includes: a silicon or other substrate 10; source/drain regions 12 and 14, as well a gate structure 22 (thin gate oxide and gate, shown undifferentiated in FIG. 1) for a first memory cell transistor;

source/drain regions 16 and 18, as well as a gate structure 24 for a second memory cell transistor; a thick field oxide layer 20 for electrically isolating the transistors; a thin oxide layer 26; a BPSG oxide layer 28; a titanium/platinum bottom ferroelectric capacitor electrode 30; a ferroelectric dielectric layer 32 such as PZT or the like; a platinum top ferroelectric capacitor electrode 34; interlevel oxide layer 36; a local interconnect layer 38; a patterned titanium barrier layer 40; a patterned aluminum/silicon/copper first-level metalization layer 42; an oxide layer 44; and a patterned titanium nitride layer 46. Five first-level metal contacts 45 are shown in FIG. 1, which include patterned metal layers 42, 44, and 46. The partially fabricated integrated circuit ferroelectric memory of FIG. 1 is but one example of a ferroelectric device or structure having a first-level metalization scheme that can use the dual-level metalization method of the present invention. Any other integrated circuit ferroelectric device or structure can be used as the starting point for the dual-level metalization method of the present invention.

Figure 2:
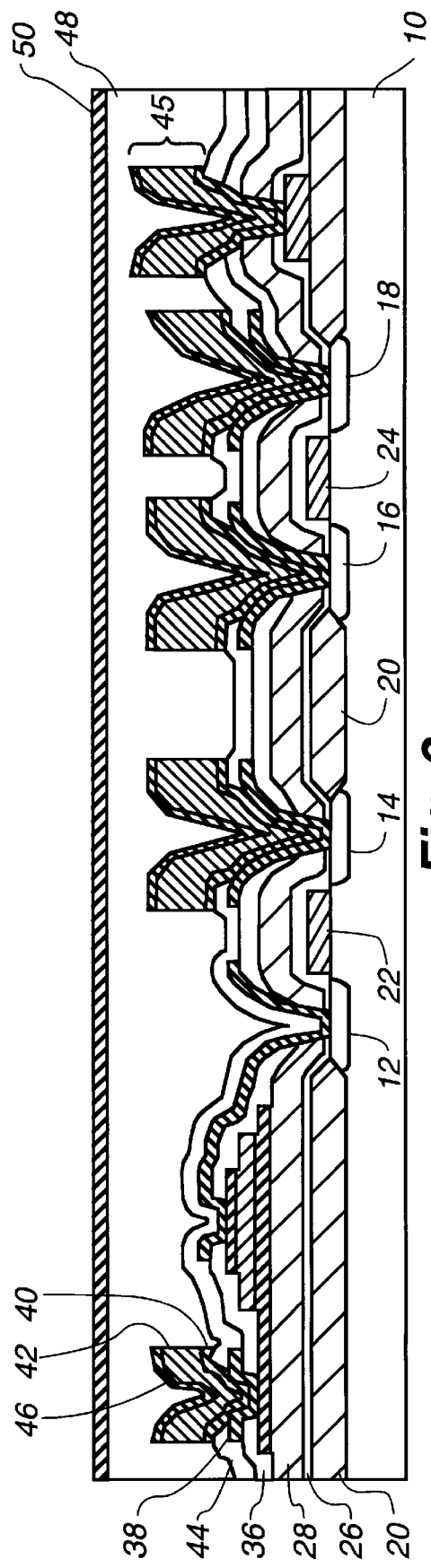

In FIG. 2 an oxide layer 48 is formed over the integrated circuit ferroelectric device by plasma depositing or spin-on to a conformal thickness of about 10,000 to 20,000 Angstroms (10 to 20 $\mu$m). Oxide layer 48 is planarized to a maximum thickness of about 5,000 Angstroms (5 $\mu$m) by chemical-mechanical polishing (CMP). Also shown in FIG. 2, a cap layer 50 is formed over the planarized oxide layer 48 by either sputtering, sol-gel, or other techniques to a thickness of about 200 to 10,000 Angstroms. Cap layer 50 can be formed of doped and undoped titanates, zirconates, niobates, tantalates, stanates, hafnates, and manganates. Cap layer 50 can either be ferroelectric or non-ferroelectric. Cap layer 50 is selected primarily for its ability to absorb hydrogen and to protect the ferroelectric dielectric layer 32 from degradation due to the stress of subsequent processing steps and not for its own electrical switching properties. Cap layer 50 can be formed of doped or undoped PZT, BST, or SBT, which may or may not be the same material selected for dielectric layer 32. Cap layer 50 and dielectric layer 32 may be the same, for example, if only one ferroelectric sputtering target is desired. Cap layer 50 and dielectric layer 32 may be different, for example, if a lower-cost target or method of forming cap layer 50 is desired. Once cap layer 50 has been formed, it may be stabilized if desired with an optional heat treatment. The time and temperature of the heat treatment will vary with the type of material selected for cap layer 50.

Figure 3:
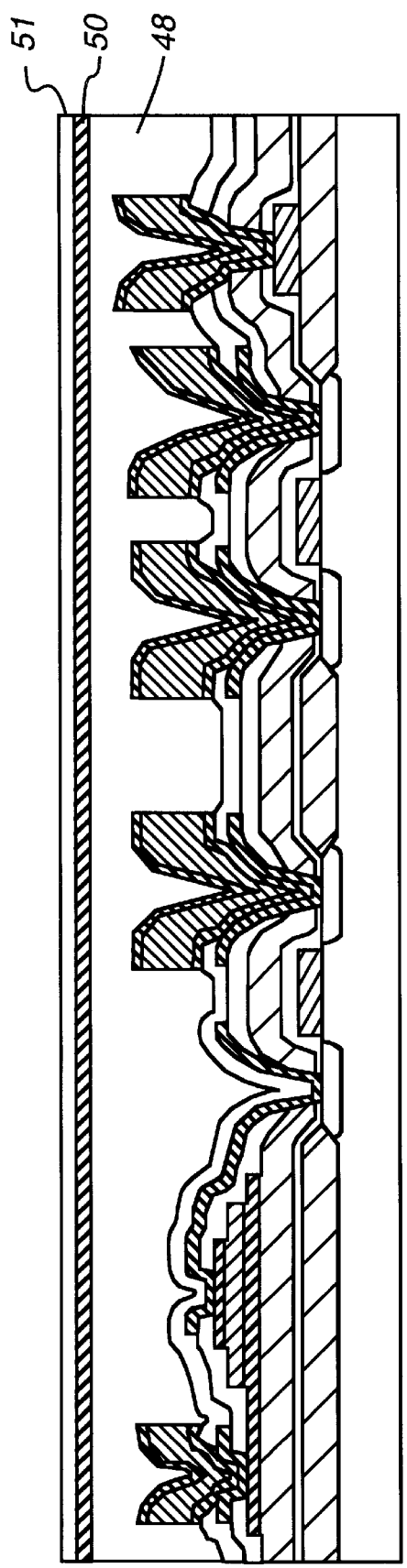

In FIG. 3 an optional oxide layer 51 is formed over cap layer 50 to a thickness of between 500 and 5000 Angstroms. Oxide layer 51 may be used to prevent potential problems related to the direct contact of cap layer 50 with the subsequent second-level metal materials, such as aluminum.

Figure 4:
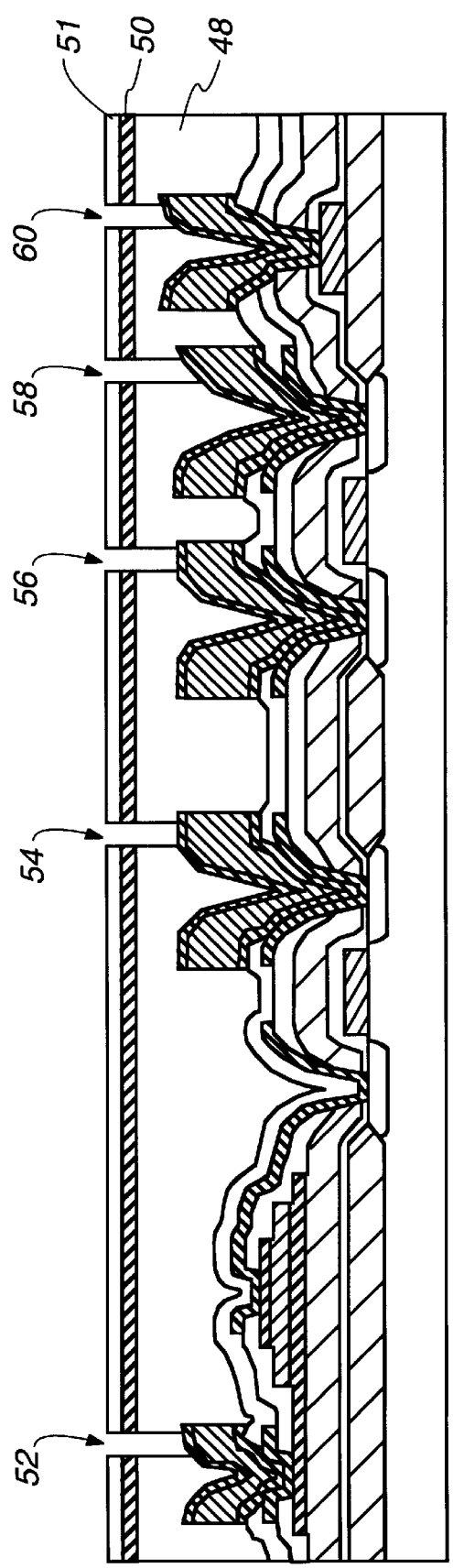

In FIG. 4 vias 52, 54, 56, 58, and 60 are formed into the planarized oxide layer 48, cap layer 50, and optional oxide layer 51 to provide access to selected first-level metal contacts 45. In FIG. 3, access is made to all of the first-level metal contacts 45. This is an example only, and access can be made to the first-level metal contact or not made as required for a given application. Etching is typically accomplished by a reactive-ion etch (RIE). While the RIE etch will be tailored to the specific cap layer 50 and planarized oxide layer 48 as required, a desirable RIE etch includes a gas mixture of $CHF_3$, $C_2F_6$, and helium energized to 700 Watts in a vacuum of about 1900 mTorr.

Figure 5:
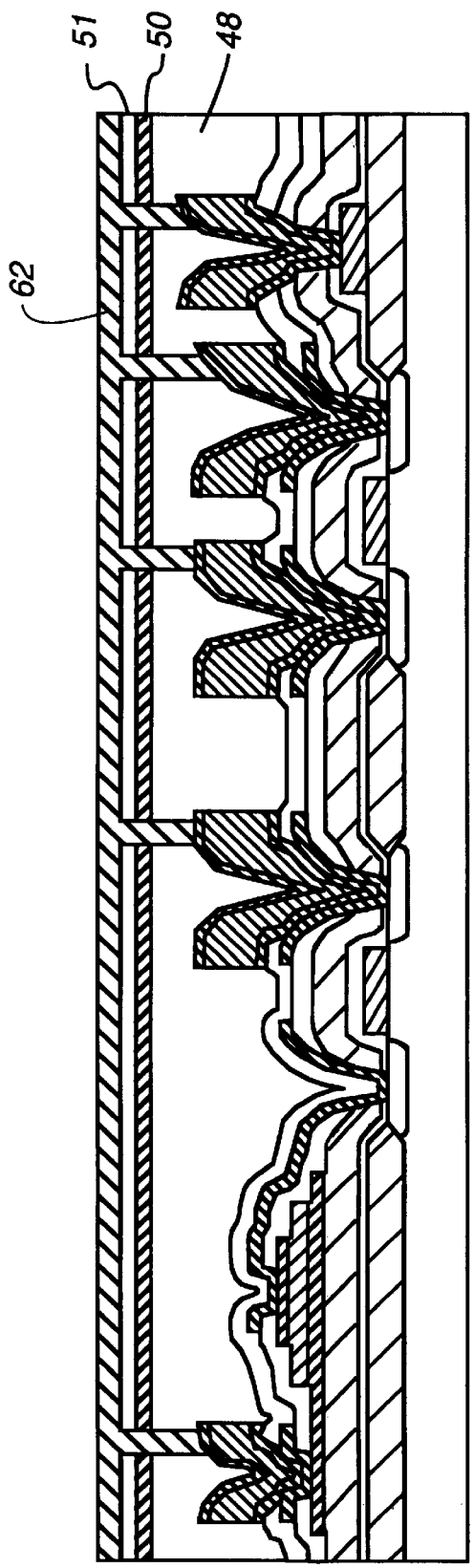

In FIG. 5, the selected first-level metal contacts are initially metalized with a tungsten layer 62, including the pre-deposition of a thin TiN nucleation layer, typically 100 to 1000 Angstroms thick. The thin TiN nucleation layer is used to ensure the proper adhesion of the tungsten layer 62. Tungsten layer 62 is formed to a thickness of about 5,000 Angstroms, but at a minimum should be of sufficient thickness to completely fill previously formed vias 52–60. If desired, layer 62 can also be formed of copper or aluminum, as well as alloys of these metals.

Figure 6:
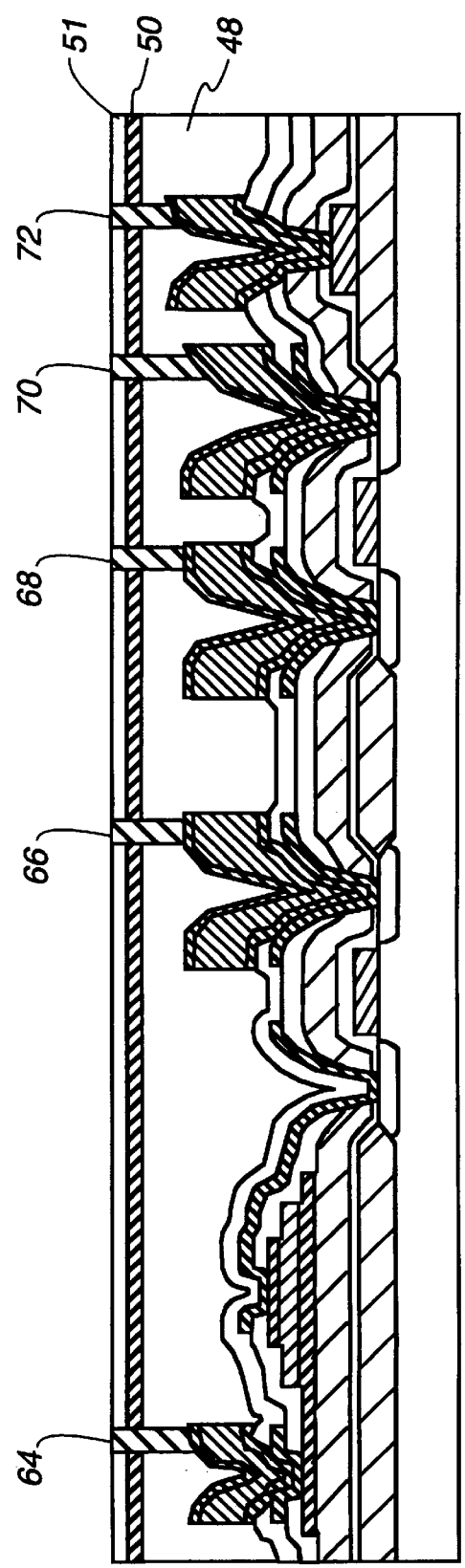

In FIG. 6, the tungsten layer 62 is removed by CMP except for the tungsten plugs 64, 66, 68, 70, and 72 remaining in vias 52–60.

Figure 7:
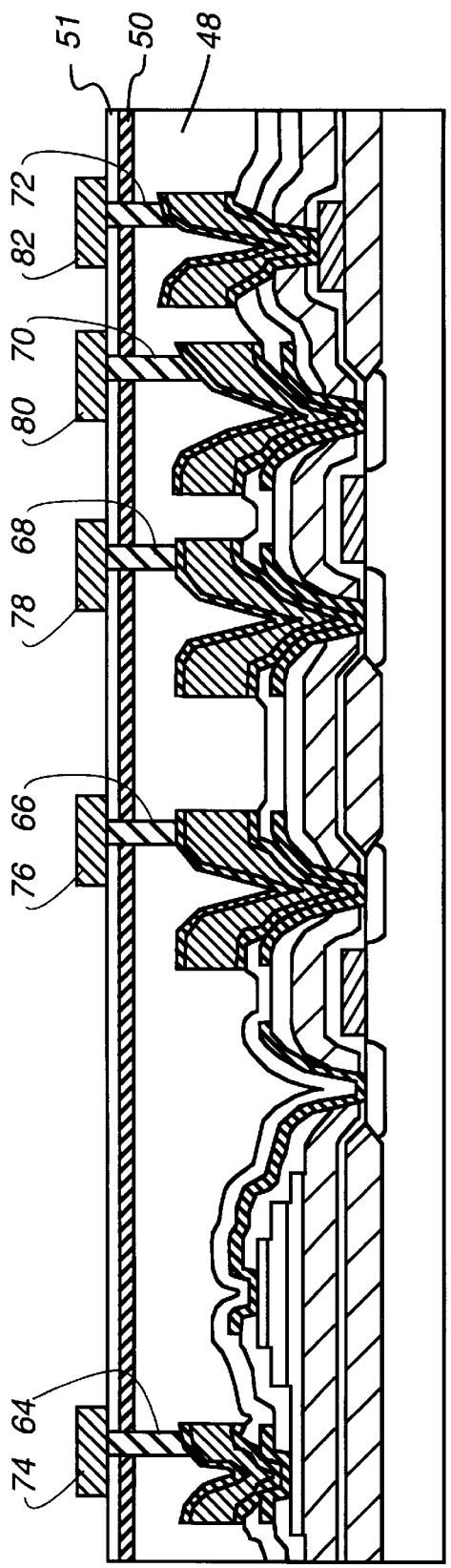

In FIG. 7, tungsten plugs 64–72 are metalized with a second layer of metal. Patterned metal areas 74, 76, 78, 80, and 82 are shown in electrical contact with tungsten plugs 64–72. The metal used to form metal areas 74–82 can be aluminum or an alloy of aluminum and copper, or an alloy of aluminum, copper, and silicon, or other conventional metalization layers as desired. Metal areas 74–82 and metal plugs 64–72 together form the second-level metal for the method of the present invention.

Figure 8:
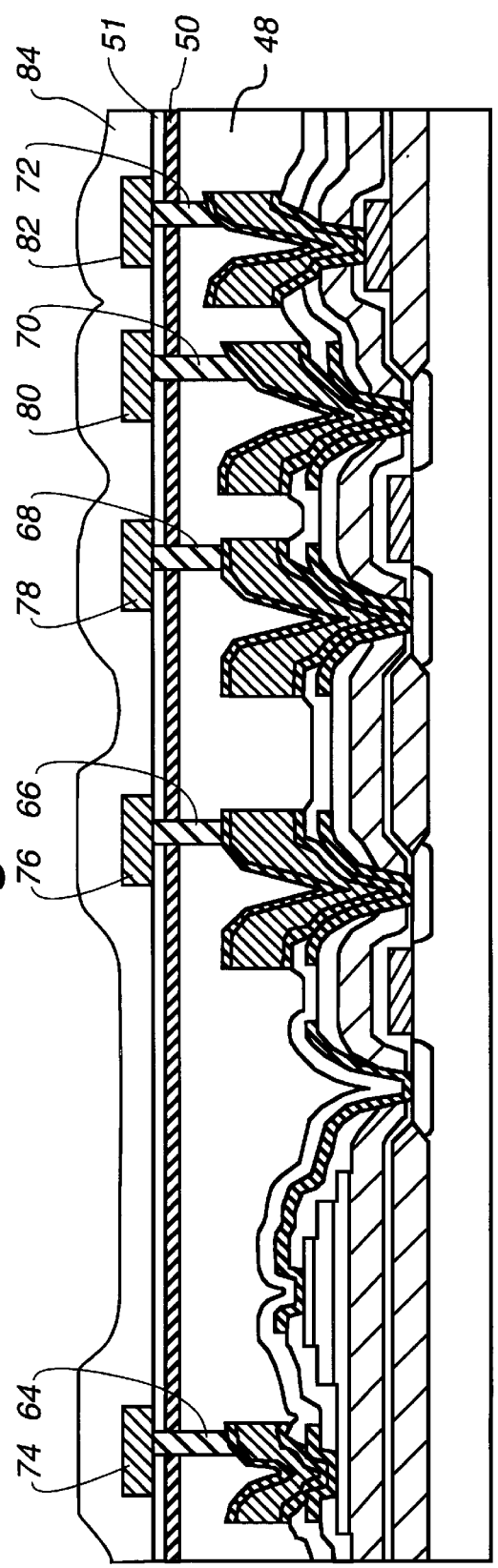

In FIG. 8, the integrated circuit is passivated with passivation layer 84. Passivation layer 84 can be a conventional passivation layer such as $SiO_2$ or $Si_3N_4$, or the like, or a passivation layer as described in U.S. Pat. Nos. 5,578,867 and 5,438,023, both of which are assigned to the assignee of the present application, and both of which are hereby incorporated by reference.

Figure 9:
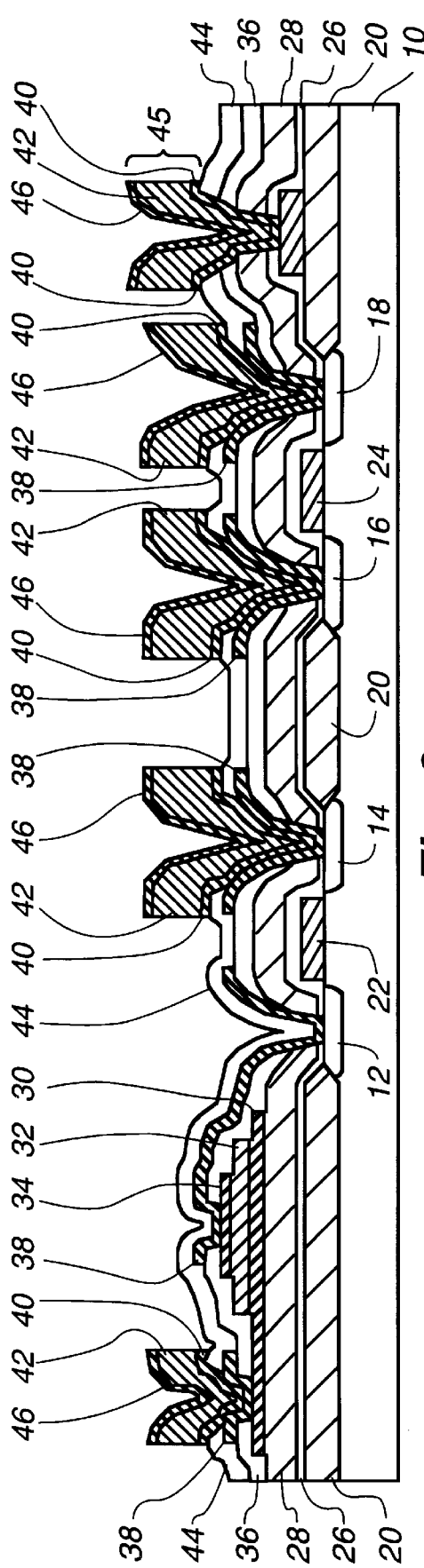
FIGS. 9–16 are sequential cross-sectional views of an integrated circuit ferroelectric memory being fabricated with a dual-level metalization method according to a second method of the present invention.

FIG. 9 is identical to FIG. 1, and serves as the starting point for the second method of the present invention. An integrated circuit ferroelectric device is shown having five first-level metal contacts 46. The same number designations are used for the same layers as were used in FIGS. 1–8.

Figure 10:
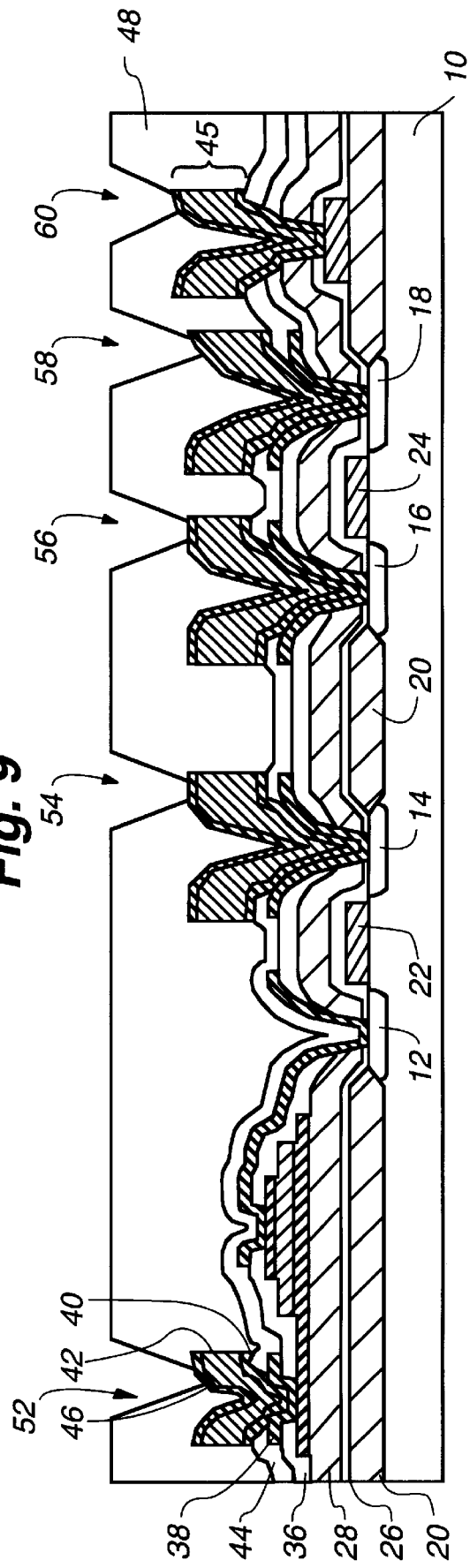

In FIG. 10, a planarized oxide layer 48 is formed over the integrated circuit ferroelectric device. After oxide layer 48 is formed and planarized, vias 52–60 having sloped sidewalls are etched into the planarized oxide layer 48 to provide access to selected first-level metal contacts 45. The angle of the sidewall slope is used to facilitate the subsequent deposition of cap layer 50 and optional oxide layer 51. The sloping sidewalls may be etched by conventional means such as wet chemical etching or an isotropic reactive-ion etch (RIE).

Figure 11:
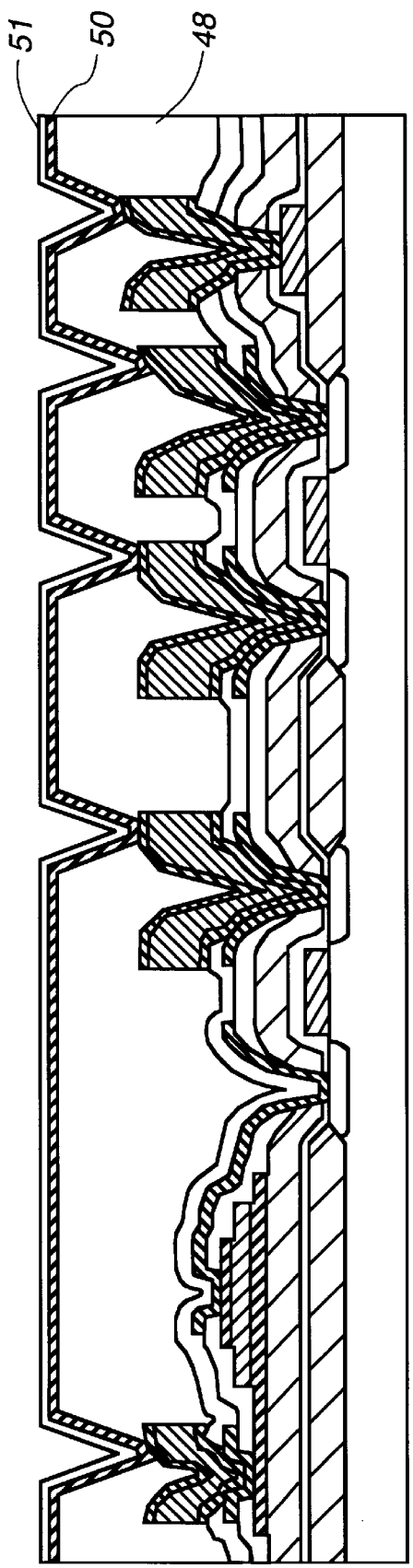

In FIG. 11, cap layer 50 and optional oxide layer 51 are formed over the planarized oxide layer 48 and vias 52–60. Cap layer 50 and optional oxide layer 51 conformally coat the surface of cap layer 50 and the sidewalls and bottom portion of vias 52–60.

Figure 12:
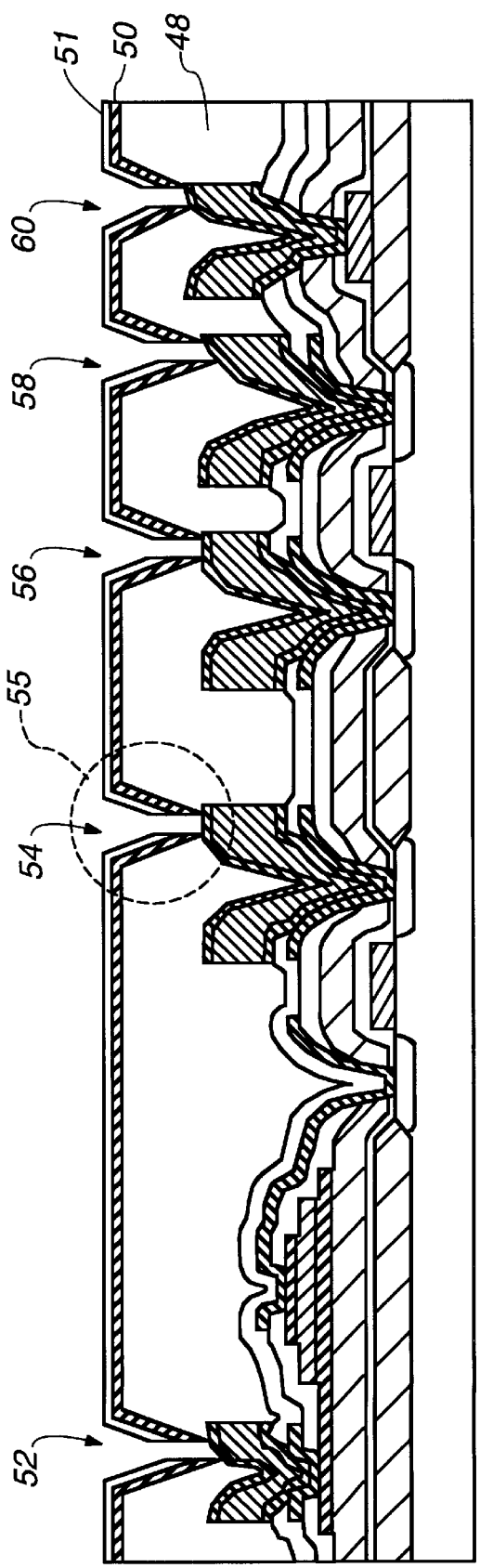

In FIG. 12, the bottom portion of vias 52–60 are etched to provide access to first level contacts 45. While vias 52–60 may be further etched exactly as shown in FIG. 12, numerous variations exist for the etching of cap layer 50 and optional oxide layer 51. Some of these variations are shown in further detail in FIGS. 12A–12F.

Figure 12A:
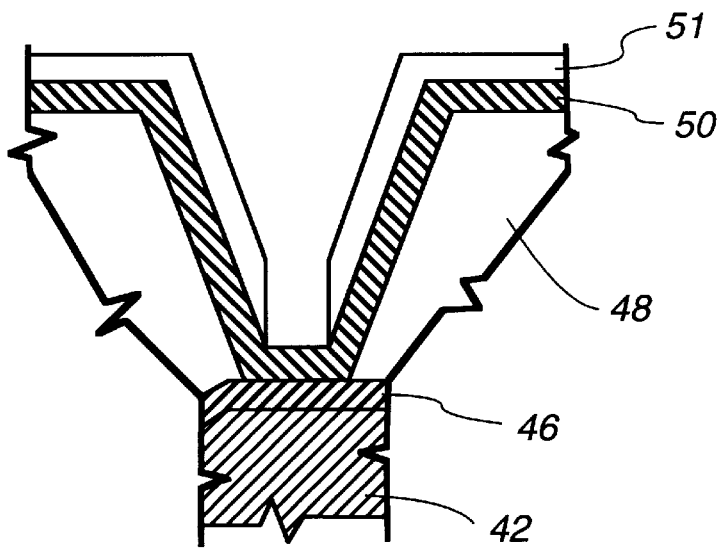
FIGS. 12A–12F are cross-sectional views of a via associated with the second method of the present invention illustrating alternative methods for forming the protective cap layer inside the via.
Figure 12B:
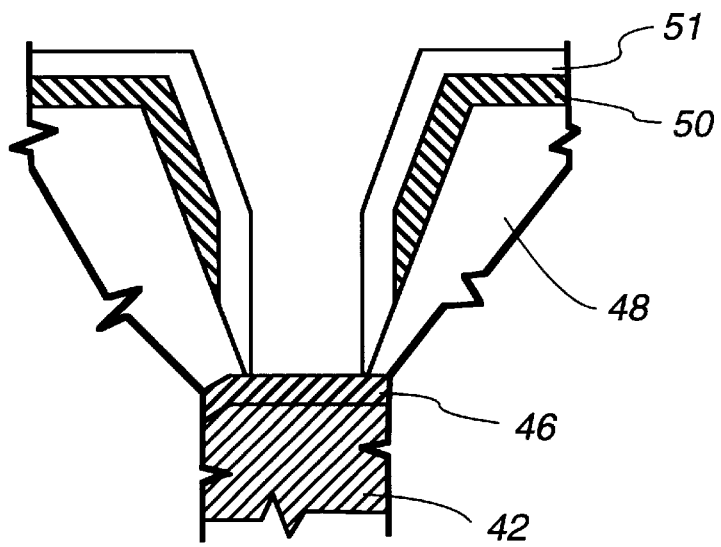
Figure 12C:
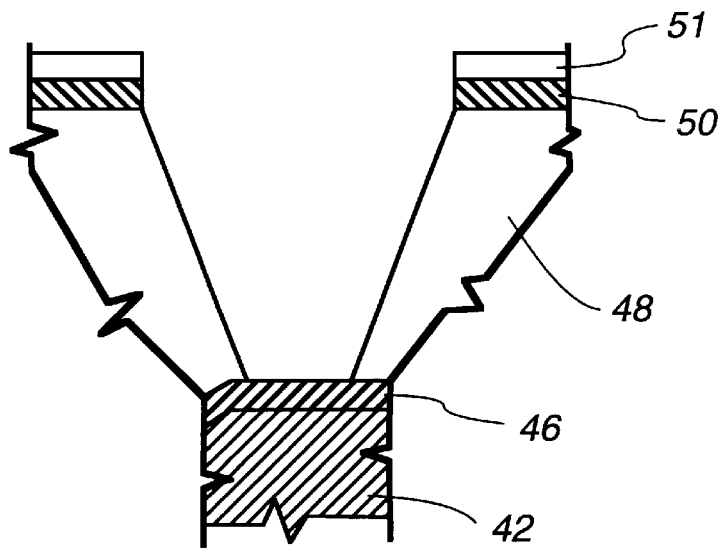
Figure 12D:
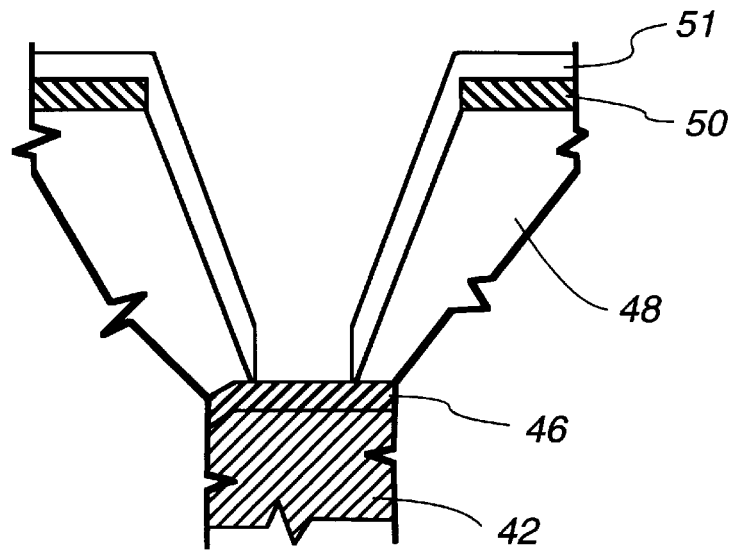
Figure 12E:
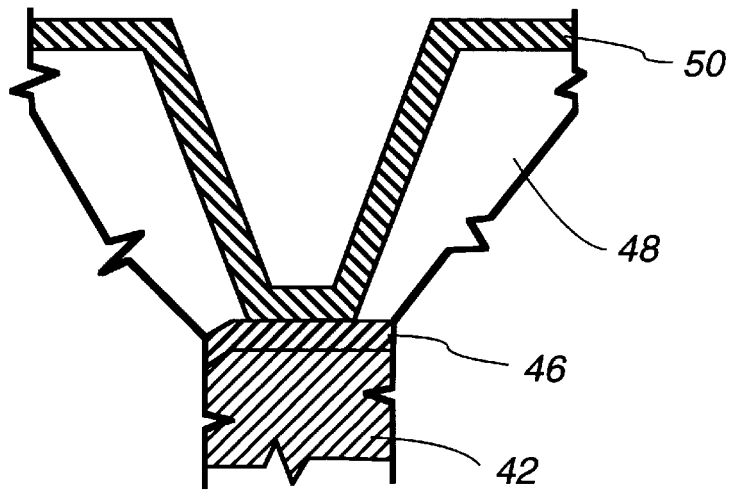
Figure 12F:
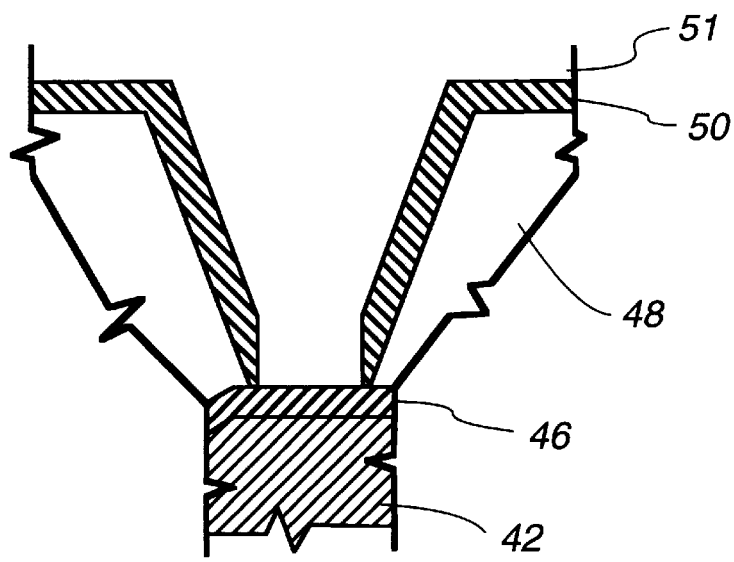

In FIG. 12A, only the optional oxide layer 51 is etched at the bottom portion of the via. Cap layer 50 is left unetched at the bottom of the via. Depending on the thickness of cap layer 50 and the resistivity of this layer, it may be acceptable, if desired, to leave the cap layer unetched. In other words, the remaining portion of cap layer 50 may not significantly increase the series resistance of the subsequently formed metal plug. In FIG. 12B, cap layer 50 has been deposited first and etched beyond the immediate area of the bottom of the via. Optional oxide layer 51 has been subsequently deposited and etched to the dimensions of the bottom of the via, thereby overlapping and sealing cap layer 50. In FIG. 12C, both the cap layer 50 and the optional oxide layer 51 have been etched at the top of the via, which is similar to the profile shown in FIG. 4, except for the sloping sidewalls of the via. In FIG. 12D, cap layer 50 has been deposited first and etched at the top of the via. Optional oxide layer 51 has been subsequently deposited and etched to the dimensions of the bottom of the via, thereby overlapping cap layer 50. FIG. 12E shows the cross-section of the via in which only the unetched cap layer 50 is present, and FIG. 12F shows the cross-section of the via in which only cap layer 50 is present, and etched corresponding to the dimensions of the bottom of the via.

Figure 13:
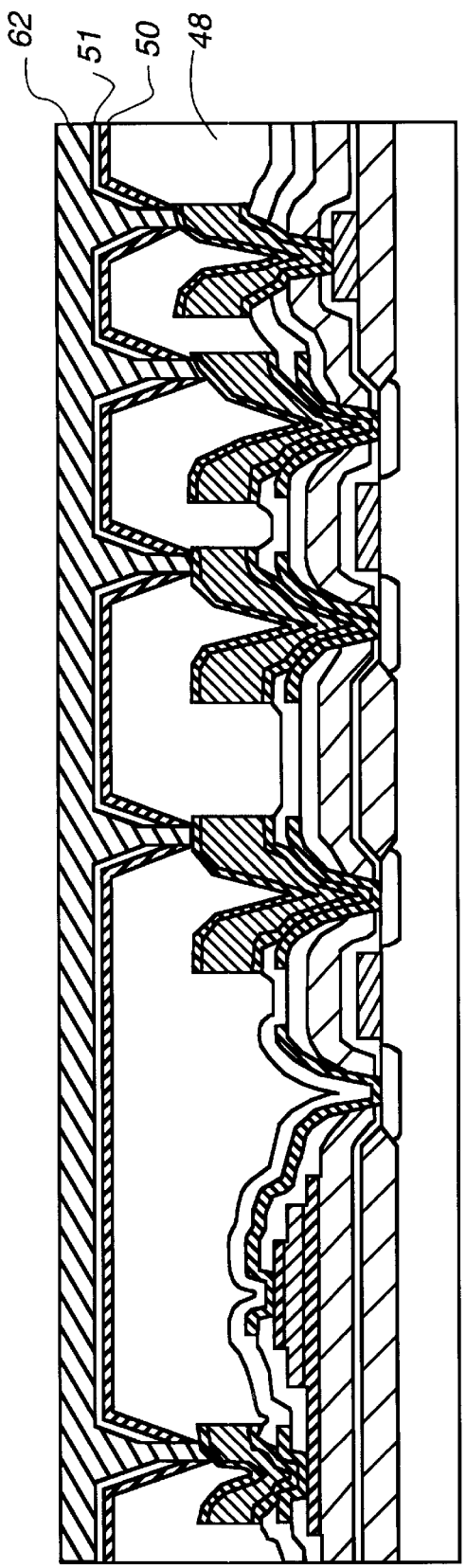
Figure 14:
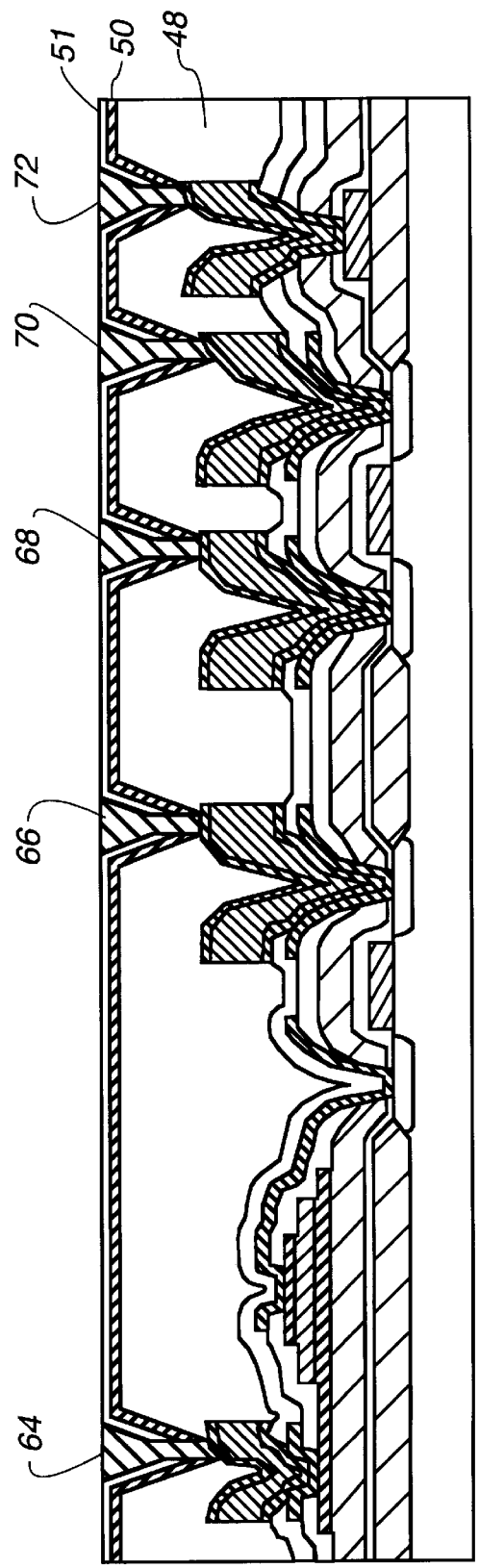
Figure 15:
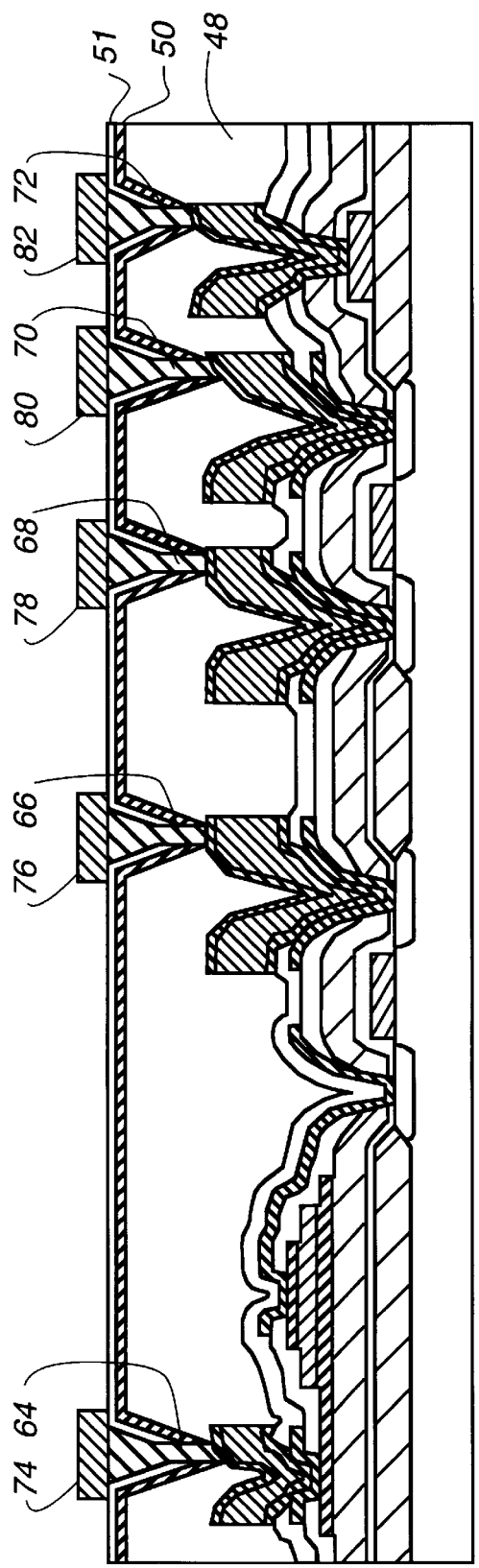
Figure 16:
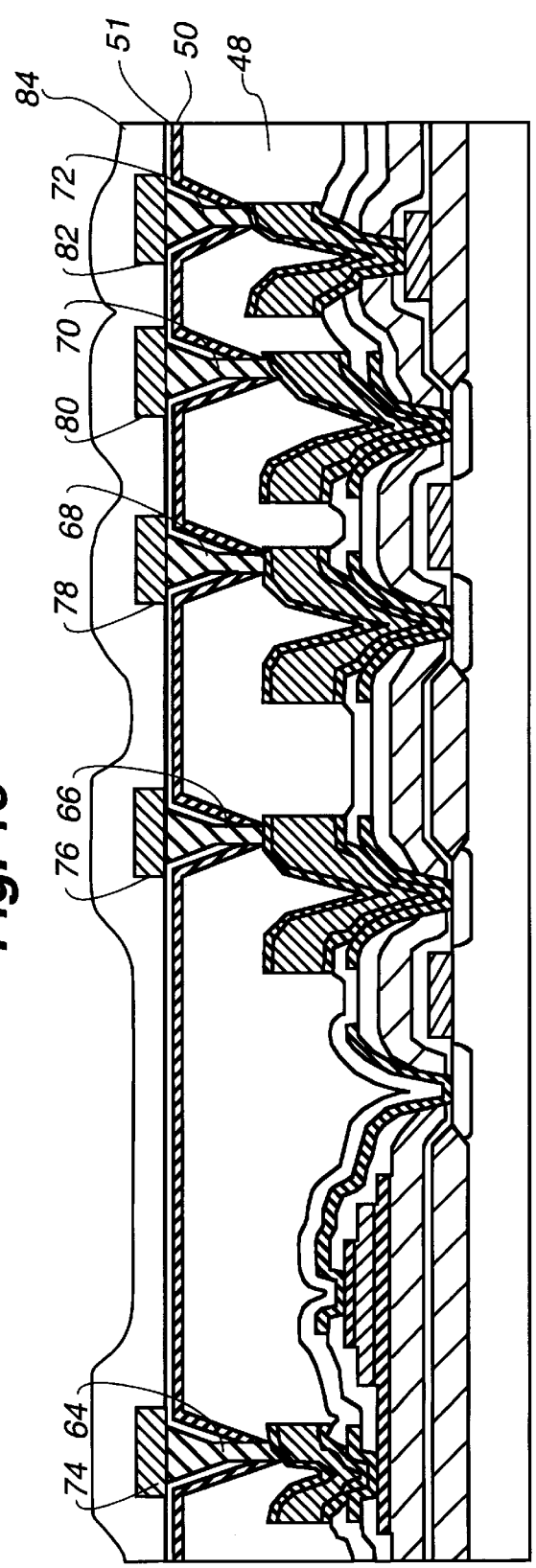

The selected first-level metal contacts 45 are metalized with second-level metal and passivated in FIGS. 13–16, and correspond to previously described FIGS. 5–8. In FIG. 13, a tungsten or other metal layer 62 is formed, and in FIG. 14 the upper portion of layer 62 is removed to form metal plugs 64–72. In FIG. 15, the metal plugs are metalized with patterned second-level metal portions 74–82. In FIG. 16, the entire surface of the integrated circuit is passivated with passivation layer 84.

Figure 17:
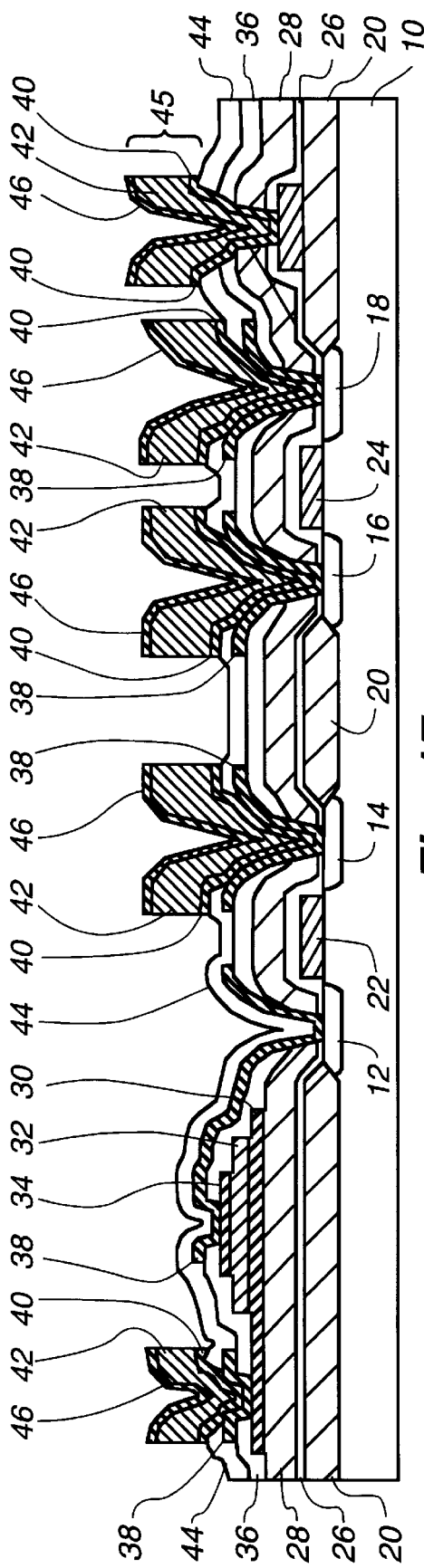
FIGS. 17–22 are sequential cross-sectional views of an integrated circuit ferroelectric memory being fabricated with a dual-level metalization method according to a third method of the present invention.

FIG. 17 is again identical to FIG. 1, and serves as the starting point for the third method of the present invention. An integrated circuit ferroelectric device is shown having five first-level metal contacts 45. The same number designations are used for the same layers as were used in FIGS. 1–8, although the exact shapes of the layers may be altered.

Figure 18:
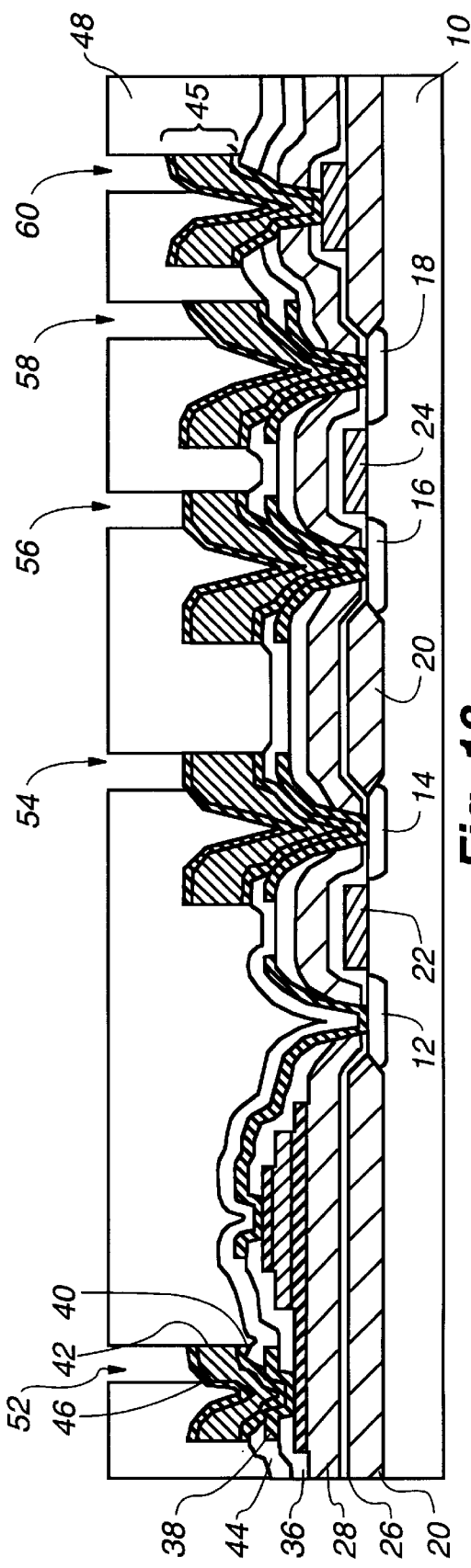

In FIG. 18, a planarized oxide layer 48 is formed over the integrated circuit ferroelectric device. After oxide layer 48 is formed and planarized, trench vias 52–60 are etched into the planarized oxide layer 48 to provide access to selected first-level metal contacts 45. The trench vias may have the benefit of providing tighter packing density on the integrated circuit. The trench vias may be etched by conventional means such as a reactive-ion etch (RIE).

Figure 19:
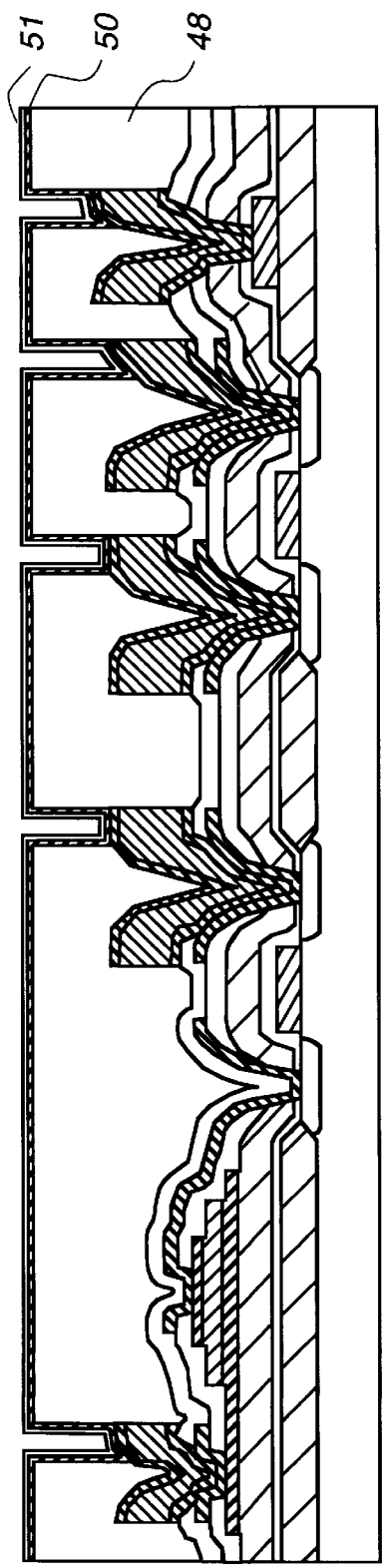

FIG. 19 corresponds to previous FIG. 11, in which cap layer 50 and optional oxide layer 51 are formed over the planarized oxide layer 48 and trench vias 52–60. Cap layer 50 and optional oxide layer 51 conformally coat the surface of cap layer 50 and the sidewalls and bottom portion of vias 52–60. It may be necessary to adjust the thicknesses of cap layer 50 and optional oxide layer 50 to enable a conformal coating of the steep sidewalls of trench vias 52–60

Figure 20:
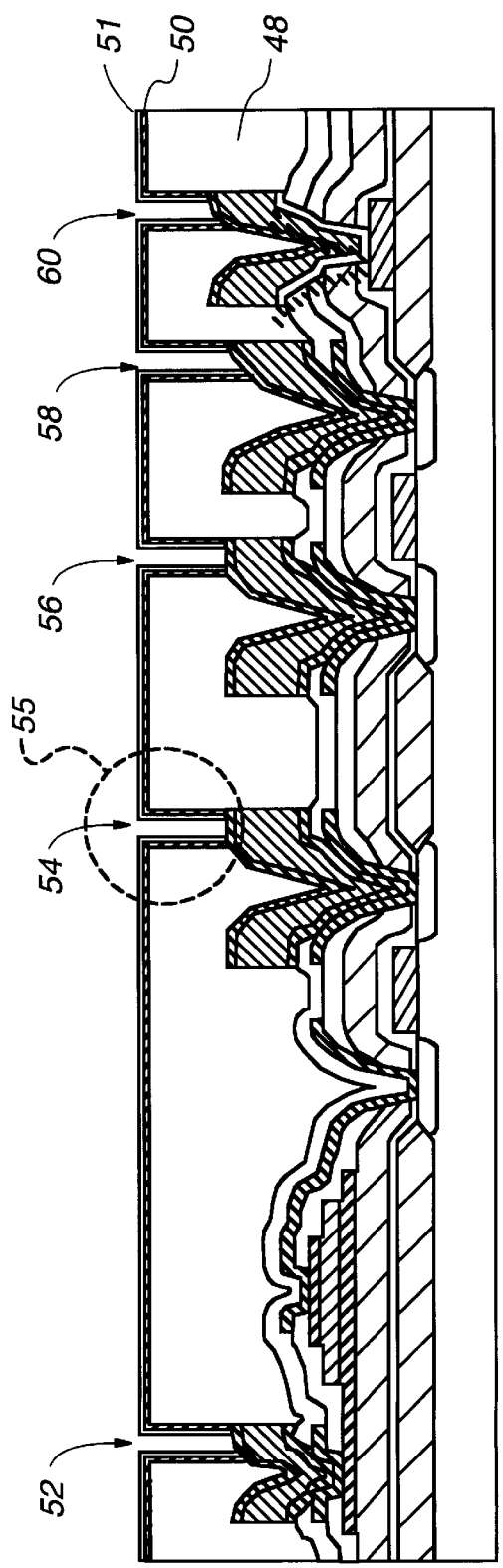

FIG. 20 corresponds to previous FIG. 12, in which the bottom portion of vias 52–60 are etched to provide access to first level contacts 45. While vias 52–60 may be further etched exactly as shown in FIG. 12, numerous variations exist for the etching of cap layer 50 and optional oxide layer 51. Some of these variations are shown in FIGS. 20A–20D.

In FIG. 20A, only the optional oxide layer 51 is etched at the bottom portion of the via. Cap layer 50 is left unetched at the bottom of the via. Depending on the thickness of cap layer 50 and the resistivity of this layer, it may be acceptable, if desired, to leave the cap layer unetched. In other words, the remaining portion of cap layer 50 may not significantly increased the series resistance of the subsequently formed metal plug. In FIG. 20B, cap layer 50 has been deposited first and etched at the top of the via. Optional oxide layer 51 has been subsequently deposited and etched to the dimensions of the bottom of the via, thereby overlapping and sealing cap layer 50. FIG. 20C shows the cross-section of the via in which only the unetched cap layer 50 is present, and FIG. 20D shows the cross-section of the via in which cap layer 50 is etched to the dimensions of the bottom of the via.

Figure 21:
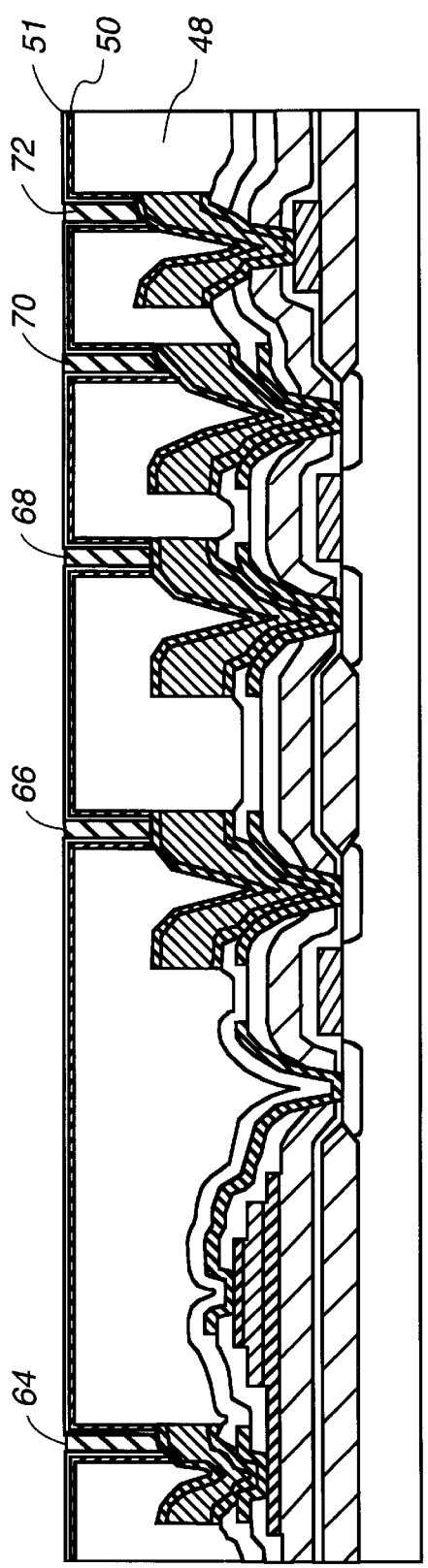
Figure 22:
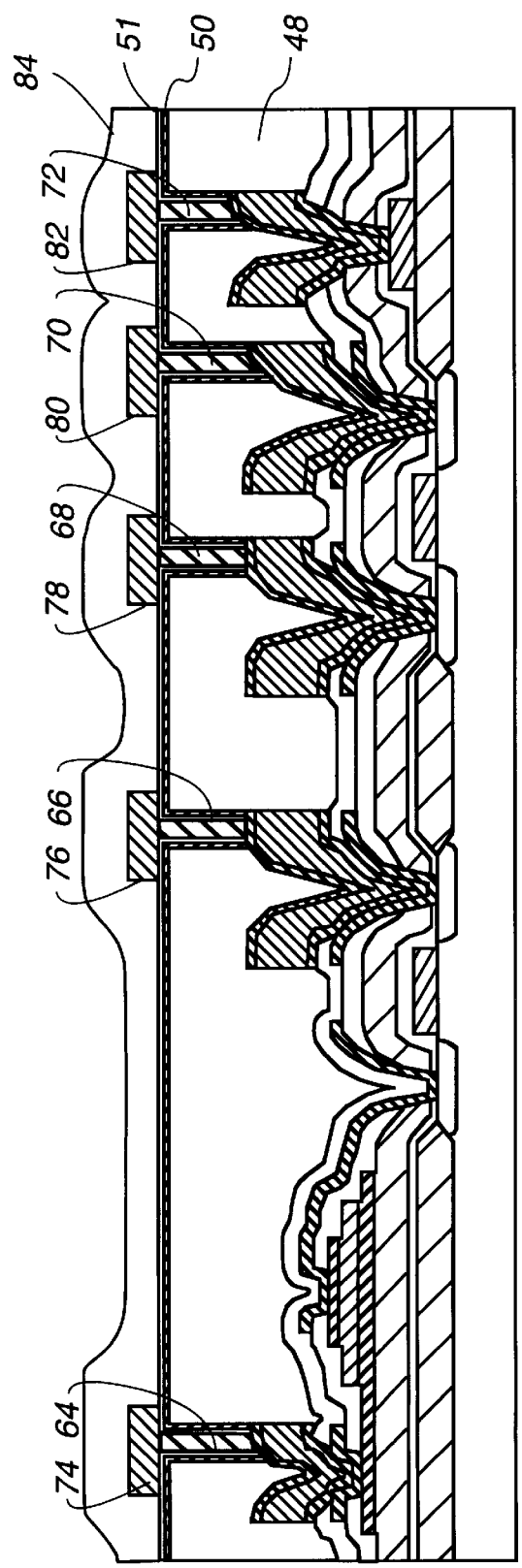

The selected first-level metal contacts 45 are metalized with second-level metal and passivated in FIGS. 21–22, and these two figures correspond to the previous four drawings of FIGS. 5–8.

Figure 23:
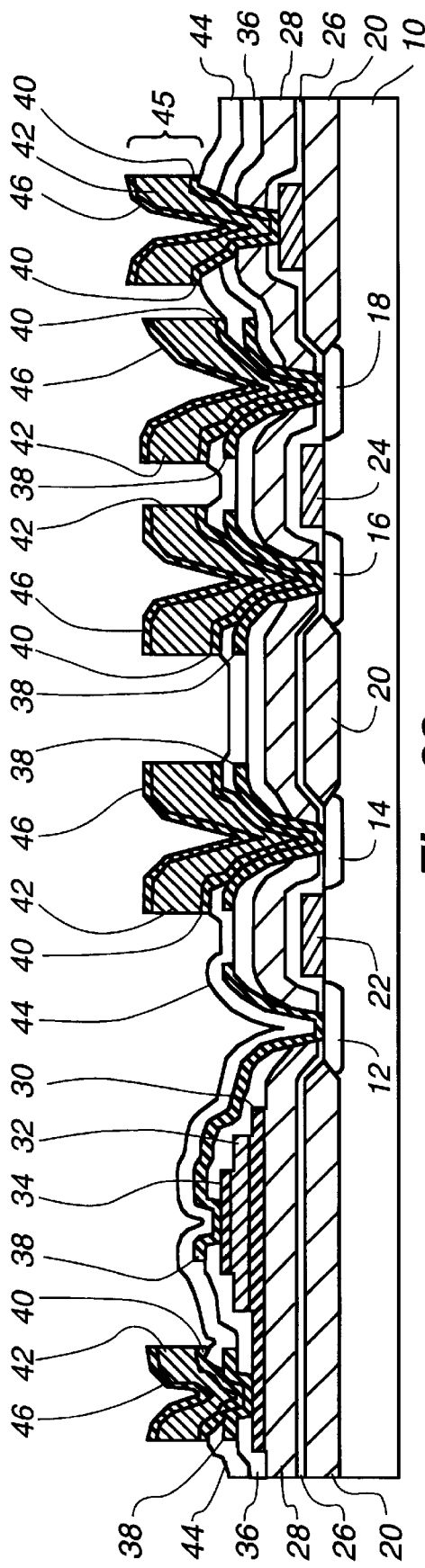
FIGS. 23–28 are sequential cross-sectional views of an integrated circuit ferroelectric memory being fabricated with a dual-level metalization method according to a fourth method of the present invention.
Figure 24:
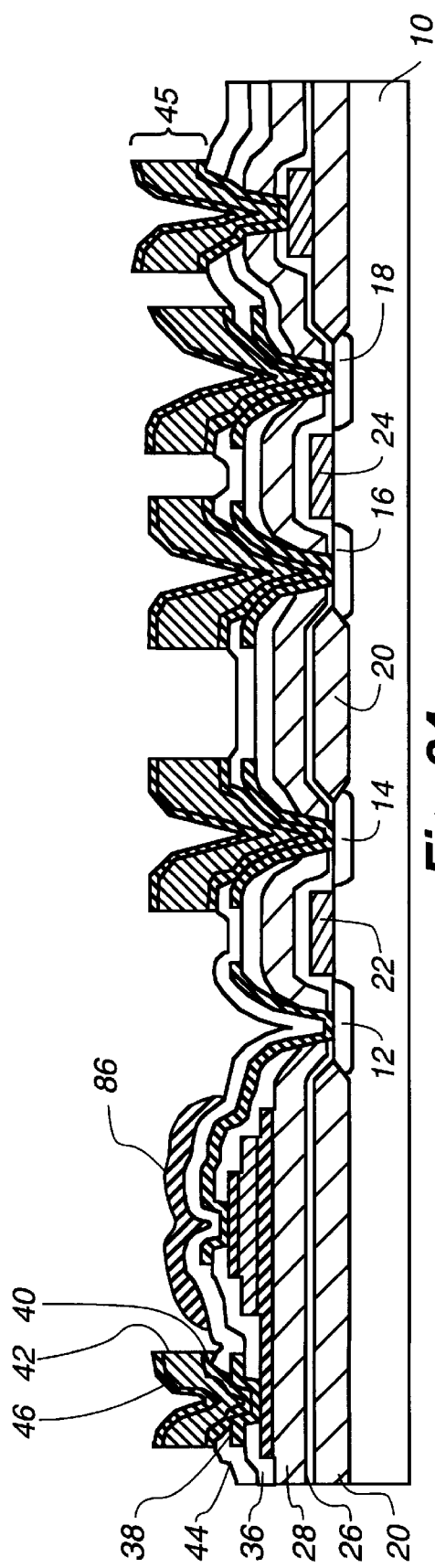
Figure 25:
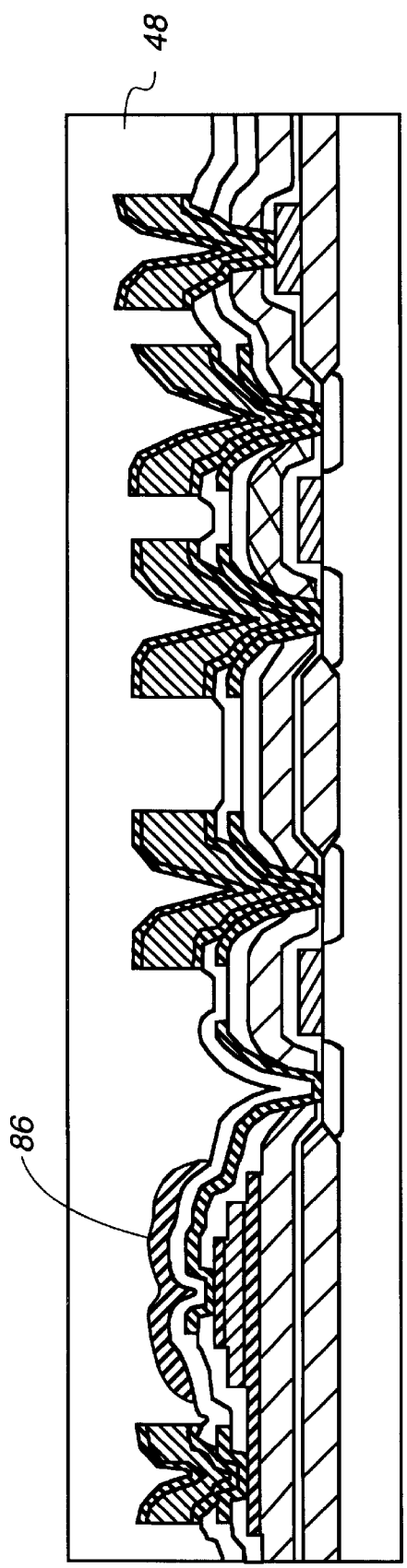
Figure 26:
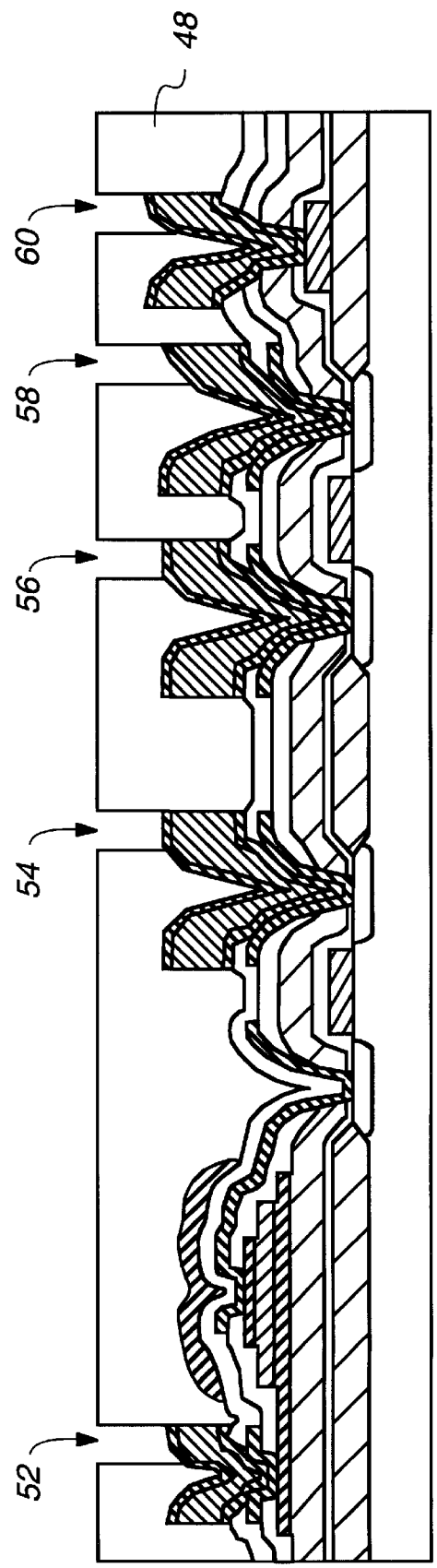
Figure 27:
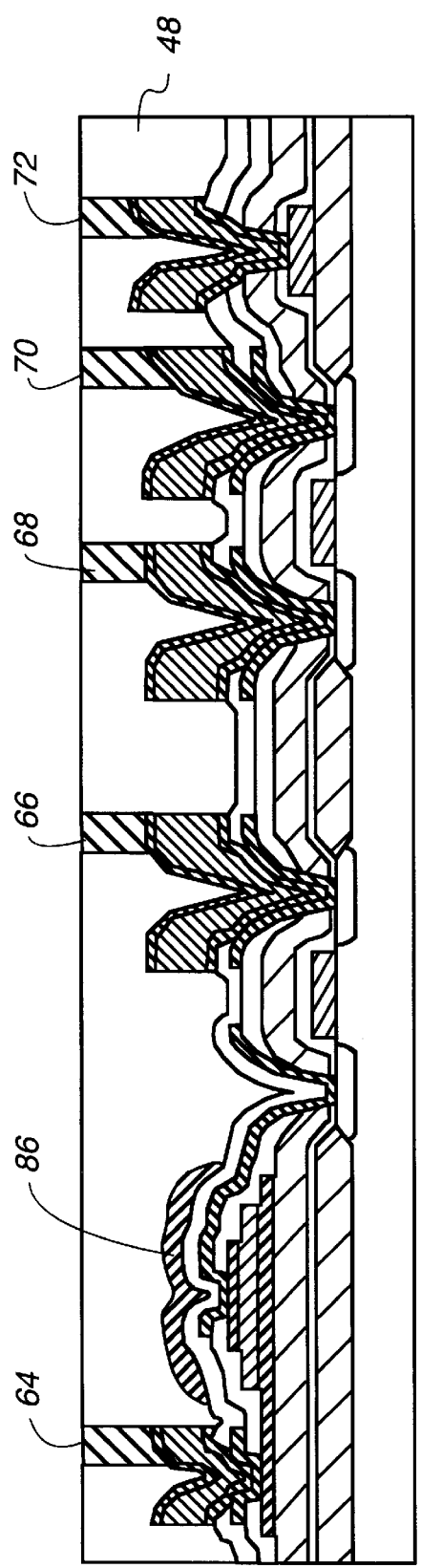
Figure 28:
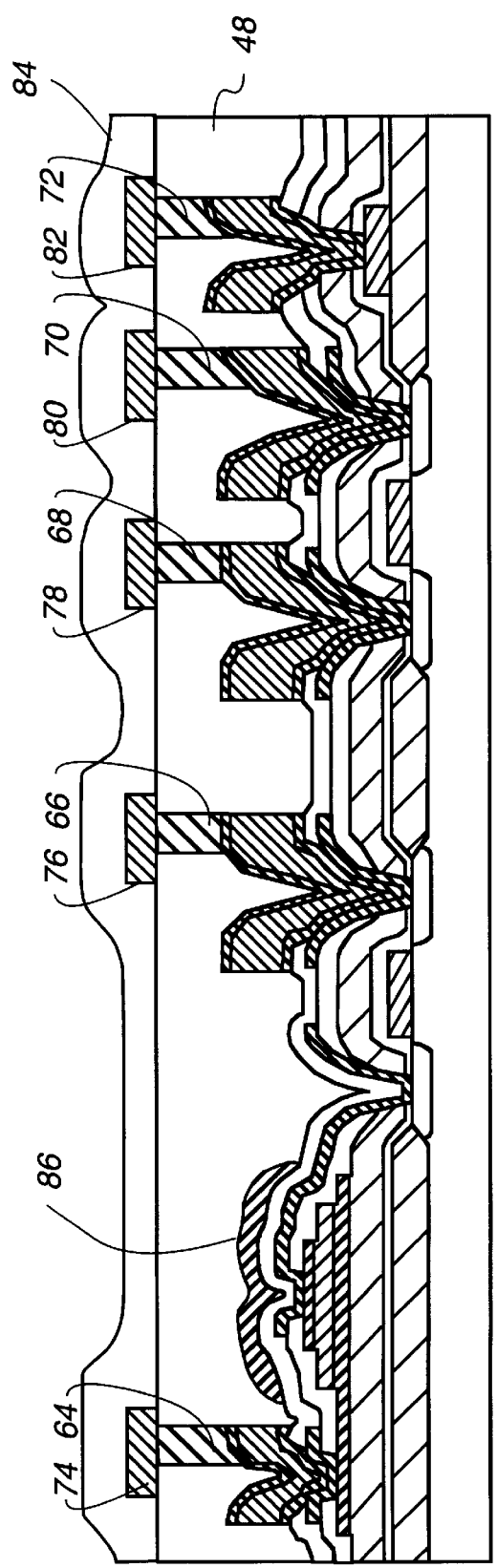

A fourth method for fabricating a two-level metal for a ferroelectric integrated circuit is shown in FIGS. 23–28. Again, the same numbers are used for the same layers as in previous drawing figures. In FIG. 23, the starting drawing figure is reproduced showing an integrated circuit ferroelectric device such as a memory, in which five first-level metal contacts 45 are shown. In FIG. 24, a cap layer is deposited and etched to form a partial cap layer 86. The partial cap layer 86 is etched to the approximate dimensions, or slightly overlapping, the dimensions of the ferroelectric layer 32 used in the integrated circuit. In FIGS. 23–28, ferroelectric layer 32 is a ferroelectric dielectric layer for a capacitor, but other ferroelectric layers can be similarly protected by partial cap layer 86. If desired, partial cap layer 86 can be patterned in a different manner than that shown in FIG. 24. For example, the dimensions of cap layer 86 can be extended laterally. It is recommended, however, that the cap layer be patterned so that it does not contact any of the first-level metal structures, which usually contain aluminum and other metals not compatible with the type of ceramic materials used for cap layer 86. In FIG. 25, an oxide layer 48 is deposited and planarized, and trench vias 52–60 are etched to the first-level metal contacts in FIG. 26. In FIG. 27, metal plugs 64–72 are formed. In FIG. 28, the metal plugs are metalized with a second-level patterned metal layer, and the entire integrated circuit is passivated.

Having described and illustrated the principles of the invention in a preferred embodiment thereof, it is appreciated by those having skill in the art that the invention can be modified in arrangement and detail without departing from such principles. For example, the following aspects of the semiconductor processes described herein can be changed as required: the types of dielectric materials; the thicknesses of the various layers; the types of ferroelectric materials; the etching processes; the electrode materials; and the exact via profile including the cap layer. Also, the specific application of the dual-level metalization method of the present invention is not limited to integrated circuit ferroelectric memory cells, although it is ideally suited to that application. We therefore claim all modifications and variation coming within the spirit and scope of the following claims.

We claim:

1. A fabrication method comprising the steps of:

forming an integrated circuit ferroelectric device having a plurality of first-level metal contacts;

forming a patterned cap layer over selected portions of the integrated circuit ferroelectric device including ferroelectric layers;

forming a planarized oxide layer over the integrated circuit ferroelectric device and patterned cap layer, such that the planarized oxide layer completely encapsulates the patterned cap layer;

forming vias into the planarized oxide layer to provide access to selected first-level metal contacts; and metalizing the selected first-level metal contacts with second-level metal.

2. The fabrication method of claim 1 in which the step of forming a patterned cap layer comprises the step of forming a layer of material selected from a group consisting of doped and undoped nitrides, titanates, zirconates, niobates, tantalates, stanates, hafnates, and manganates.

3. The fabrication method of claim 1 in which the step of forming a cap layer comprises the step of forming a layer of material selected from a group consisting of doped and undoped PZT, BST, and SBT.

4. A fabrication method comprising the steps of:

forming an integrated circuit ferroelectric device having a plurality of first-level metal contacts;

forming a planarized oxide layer over the integrated circuit ferroelectric device;

forming a cap layer over the planarized oxide layer;

forming an oxide layer over the cap layer;

subsequently forming vias into the planarized oxide layer, cap layer, and oxide layer to provide access to selected first-level metal contacts; and metalizing the selected first-level metal contacts with second-level metal.

5. A fabrication method comprising the steps of:

forming an integrated circuit ferroelectric device having a plurality of first-level metal contacts;

forming a planarized oxide layer over the integrated circuit ferroelectric device;

forming a cap layer of material selected from a group consisting of doped and undoped nitrides, titanates, zirconates, niobates, tantalates, stanates, hafnates, and manganates over the planarized oxide layer;

forming vias into the planarized oxide layer and cap layer to provide access to selected first-level metal contacts; and metalizing the selected first-level metal contacts with second-level metal.

6. A fabrication method comprising the steps of:

forming an integrated circuit ferroelectric device having a plurality of first-level metal contacts;

forming a planarized oxide layer over the integrated circuit ferroelectric device;

forming a cap layer of material selected from a group consisting of doped and undoped PZT, BST, and SBT over the planarized oxide layer;

forming vias into the planarized oxide layer and cap layer to provide access to selected first-level metal contacts; and metalizing the selected first-level metal contacts with second-level metal.

7. A fabrication method comprising the steps of:

forming an integrated circuit ferroelectric device having a plurality of first-level metal contacts;

forming a planarized oxide layer over the integrated circuit ferroelectric device;

forming trench vias into the planarized oxide layer to provide access to selected first-level metal contacts;

forming a cap layer over the planarized oxide layer and vias; and metalizing the selected first-level metal contacts with second-level metal.

8. The fabrication method of claim 7 further comprising the step of etching a portion of the cap layer in the vias.

9. A fabrication method comprising the steps of:

forming an integrated circuit ferroelectric device having a plurality of first-level metal contacts;

forming a planarized oxide layer over the integrated circuit ferroelectric device;

forming vias into the planarized oxide layer to provide access to selected first-level metal contacts;

forming a cap layer over the planarized oxide layer and vias;

forming an oxide layer over the cap layer; and metalizing the selected first-level metal contacts with second-level metal.

10. The fabrication method of claim 9 in which the step of forming vias comprises the step of forming a via having sloped sidewalls.

11. The fabrication method of claim 9 further comprising the step of etching a portion of the cap layer in the vias.

12. A fabrication method comprising the steps of:

forming an integrated circuit ferroelectric device having a plurality of first-level metal contacts;

forming a planarized oxide layer over the integrated circuit ferroelectric device;

forming vias into the planarized oxide layer to provide access to selected first-level metal contacts;

forming a cap layer of material selected from a group consisting of doped and undoped nitrides, titanates, zirconates, niobates, tantalates, stanates, hafnates, and manganates over the planarized oxide layer and vias; and metalizing the selected first-level metal contacts with second-level metal.

13. The fabrication method of claim 12 in which the step of forming vias comprises the step of forming a via having sloped sidewalls.

14. The fabrication method of claim 12 further comprising the step of etching a portion of the cap layer in the vias.

15. A fabrication method comprising the steps of:

forming an integrated circuit ferroelectric device having a plurality of first-level metal contacts;

forming a planarized oxide layer over the integrated circuit ferroelectric device;

forming vias into the planarized oxide layer to provide access to selected first-level metal contacts;

forming a cap layer of material selected from a group consisting of doped and undoped PZT, BST, and SBT over the planarized oxide layer and vias; and metalizing the selected first-level metal contacts with second-level metal.

16. The fabrication method of claim 15 in which the step of forming vias comprises the step of forming a via having sloped sidewalls.

17. The fabrication method of claim 15 further comprising the step of etching a portion of the cap layer in the vias.

* * * * *